United States Patent [19]
Iyaguchi

[11] Patent Number: 5,224,104
[45] Date of Patent: Jun. 29, 1993

[54] REAL-TIME ADDRESS SWITCHING CIRCUIT

[75] Inventor: Yoshikuni Iyaguchi, Tokyo, Japan

[73] Assignee: Ando Electric Co., Ltd., Tokyo, Japan

[21] Appl. No.: 632,344

[22] Filed: Dec. 21, 1990

[30] Foreign Application Priority Data

Dec. 25, 1989 [JP] Japan ................................. 1-335381

[51] Int. Cl.$^5$ ............................................. G06F 11/00
[52] U.S. Cl. ..................................................... 371/27
[58] Field of Search ............. 371/27, 22.1, 21.1, 371/25.1, 21.3, 15.1; 370/112

[56] References Cited

U.S. PATENT DOCUMENTS

| | | | |
|---|---|---|---|
| 3,832,535 | 8/1974 | De Vito | 371/27 |
| 4,348,759 | 9/1982 | Schnurmann | 371/22.1 |
| 4,580,264 | 4/1986 | Tannhauser et al. | 371/27 |
| 4,635,261 | 1/1987 | Anderson et al. | 371/27 |
| 4,862,460 | 8/1989 | Yamaguchi | 371/27 |

Primary Examiner—Robert W. Beausoliel, Jr.
Assistant Examiner—Phung My Chung
Attorney, Agent, or Firm—Flynn, Thiel, Boutell & Tanis

[57] ABSTRACT

A real-time address switching circuit is adapted for effecting a DRAM multiple-bits parallel test. The real-time address switching circuit includes selectors for effecting the pattern selection for the AX AY addresses to be added to a device under test, a gate for controlling the selectors at the real time, a register for latching the data bit size data and a multiplexer for receiving the outputs of the selectors and switching the AX AY addresses.

1 Claim, 3 Drawing Sheets

REAL-TIME ADDRESS SWITCHING CIRCUIT

BACKGROUND OF THE INVENTION

The present invention relates to a real time address switching circuit, more particularly to an address signal generation system and circuit for adding the address signal to a DRAM when DRAM multiple-bits parallel test is carried out on the basis of a 4 MDRAM multiple-bits parallel test system adopted by JEDEC (Joint Electron Device Engineering Council) held on April, 1987.

The system adopted by JEDEC is disclosed in the magazine entitled "NIKKEI MICRODEVICES" Separate Volume No. 1, published on May of 1987.

For performing the 4 MDRAM multiple-bits paralell test system ($\times 4$, $\times 8$, $\times 16$ parallel bits) adopted by JEDEC, it is necesary to automatically switch to the multiple-bits parallel test mode and automatically control addresses to be added to a DRAM under test on the basis of the mutiple-bits parallel test mode. The number of the data bits at the multiple-bits parallel test mode operation increases $2^n$ as many as that at the time of normal mode operation.

It is necessary to reduce the device address to $\frac{1}{2}^n$ in response to the change of the number of the data bits.

SUMMARY OF THE INVENTION

It is an object of the present invention to provide a real-time address switching circuit capable of reducing device address to $\frac{1}{2}^n$ in response to the change of the number of data bits and also capable of effecting DRAM multiple bits parallel test.

To achieve the above object, a real-time address switching circuit according to the present invention comprises a register 1 for latching a data bit size data, a gate 2 for receiving an output of the register 1 and a real-time control signal, a first selector 3 for effecting pattern selection for an AX address 14 to be added to a device under test (hereinafter referred to as DUT) 6 on the basis of the output of the gate 2, a second selector 4 for effecting pattern selection for an AY address 15 to be added to the DUT 6 on the basis of the output of the gate 2, and a multiplexer 5 for receiving an output of the first selector 3 and an output of the second selector 4, and switching data of the selected AX address 14 or AY address 15 to its output.

The above and other objects, features and advantages of the present invention will become more apparent from the following description taken in conjunction with the accompanying drawings.

PREFERRED EMBODIMENT OF THE INVENTION

Figure 3:
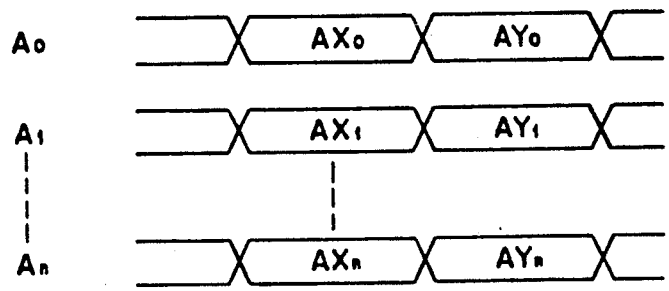
FIG. 3 is a view showing address signals of DRAM.

Before describing a real-time address switching circuit of the present invention, address signals of DRAM will be first described with reference to FIG. 3.

The addresses of AX AY address are added to the DRAM by time sharing.

The AX AY addresses are normally memory address bits and added in response to the address bits $A_0$, $A_1$ ... $A_n$, such as $AX_0$, $AY_0$ ... $A_n$ and $AX_1$, $AY_1$ ... $AY_n$ However, in case of a multiple-bits test, the depth of the memory address is reduced to $\frac{1}{4}$, $\frac{1}{8}$ and 1/16 in response to 4 bits, 8 bits and 16 bits of the DUT.

Accompanied by the reduction of the depth of the address, there is a likelihood that the address unnecessitating the AX AY addresses to be added to the memory is present. Under the circumstances, when the multibit test is made, it is necessary to control the AX AY address to be added in response to each data bit size.

In case of testing the multiple-bits parallel test of the DRAM, there are methods for writing in the normal mode and reading by the multiple-bits parallel test mode, or writing by the multiple-bits parallel test mode and reading by the normal mode or writing and reading by multi-bits parallel test mode. In carrying out these methods, it is necessary to automatically control the switching to the normal mode or the mutiple-bits parallel test mode and the address control due to the reduction of the address at the real-time.

An arrangement of the real-time address switching circuit according to the preferred embodiment of the present invention will be described with reference to FIGS. 1 and 2.

Figure 1:
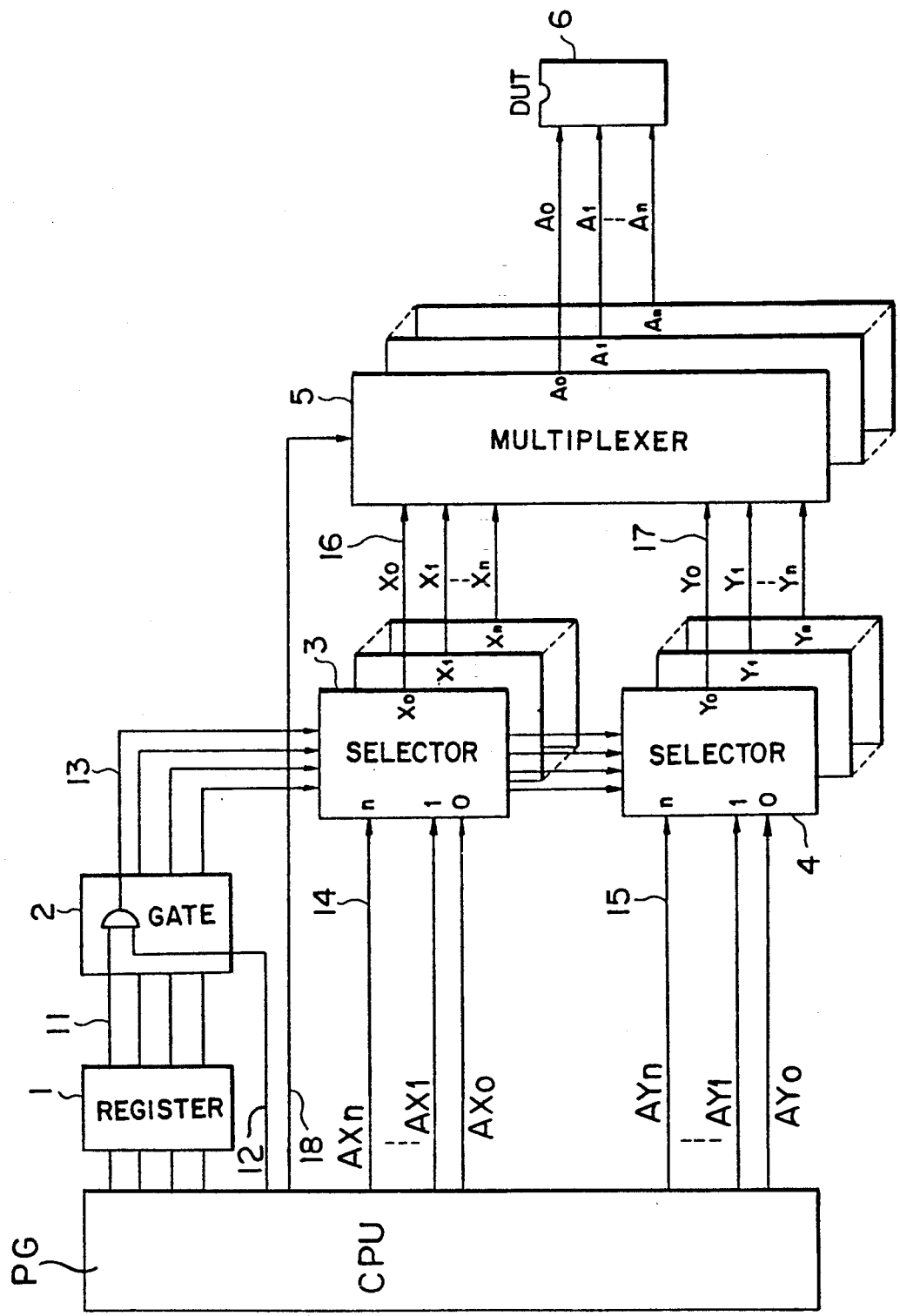
FIG. 1 is a view of assistance in explaining an arrangement of a real-time address switching circuit according to a preferred embodiment of the present invention.
Figure 2:
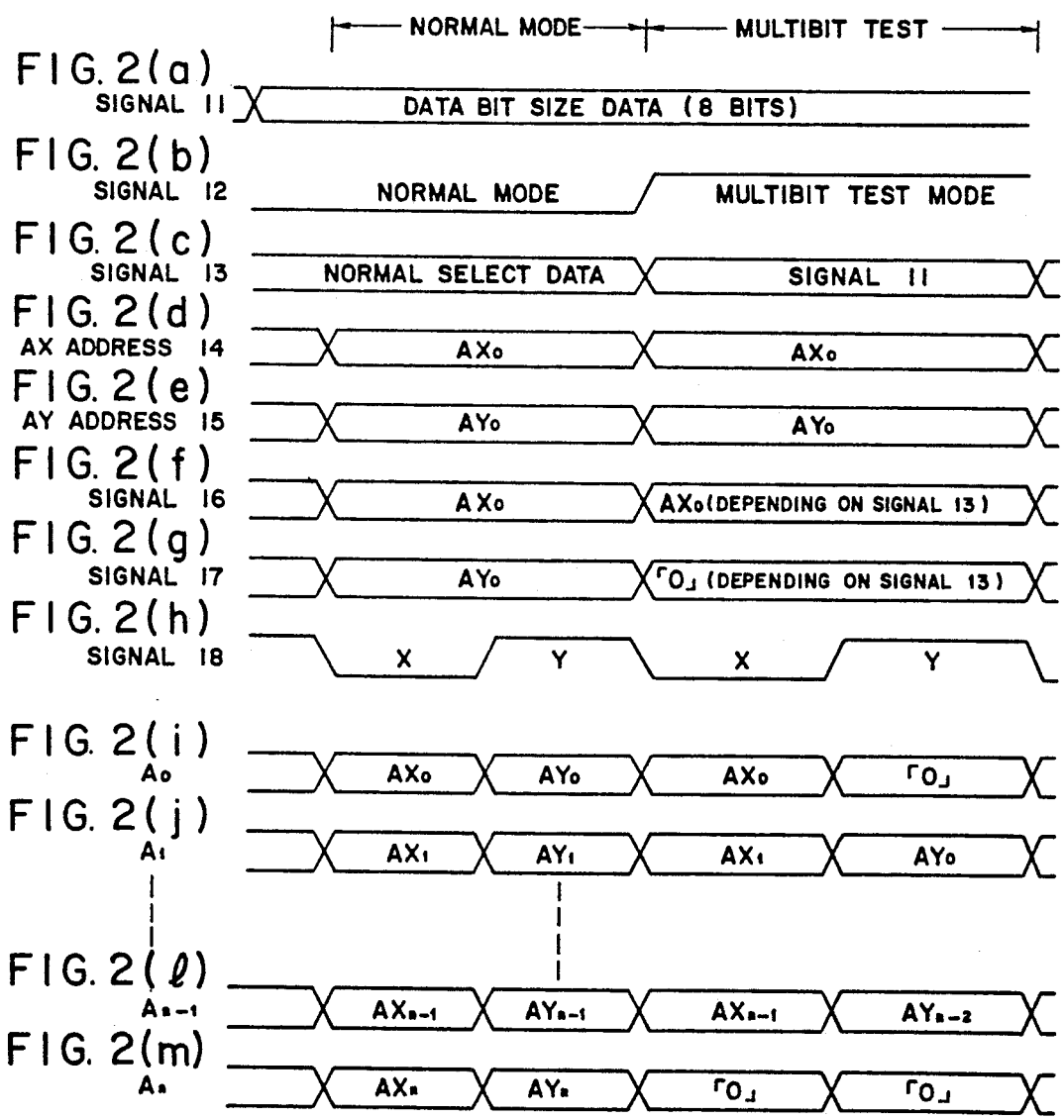
FIG. 2(a–m) is a timing chart in FIG. 1.

In FIG. 1, designated at 1 is a register, 2 is a gate, 3 is a first selector, 4 is a second selector, 5 is a multiplexer and 6 is a device under test (DUT).

In the register 1, there is set a data bit size data for testing multiple-bits size data such as data for 4 bits, 8 bits and 16 bits.

The normal mode and the multiple-bits parallel test mode are switched at real-time.

The first selector 3 selects an AX address 14 to be added to the DUT 6 when the multiple-bits parallel test is carried out.

The second selector 4 selects an AY address 15 to be added to the DUT 6 when multiple-bits parallel test is carried out.

The multiplexer 5 receives output signals 16 and 17 from the first and second selectors and switches data of the selected AX address 14 or AY address 15 to its output.

The real-time address switching circuit having the arrangement set forth above will be operated as follows.

The register 1 receives the data bit size data from a CPU PG serving as an exerciser for effecting multiple-bits parallel test and setting and delivering it to the gate 2 as signals 11. The signals 11 are data for switching the first selector 3 or the second selector 4 for effecting the mulitiple-bits parallel test. The signals 11 are issued by the exercizer (PG).

The gate 2 receives the signals 11 at one input thereof and a real-time control signal 12 at the other input thereof. Both the signals 11 and 12 are ANDed at the gate 2 for producing output signals 13. The normal mode and the multiple-bits parallel test mode are switched at the real-time by the control singal 12.

The output signals 13 produced by the gate 2 become selection signals of the first and second selectors 3 and 4 for adding $AX_0$ to $AX_n$ and $AY_O$ to $AY_n$ to the first and second selectors 3 and 4 corresponding to the address bits $A_0$ to $A_n$ of the DUT 6 at the normal mode.

The gate 2 outputs the signals 11 received from the register 1 at the muliple-bits parallel test mode. The output signals 13 output by the gate 2 become the selector data of the first and second selectors 3 and 4 so as to add the addresses corresponding to the data bit sizes to the DUT 6.

Address control circuits of the first and second selectors 3 and 4 each comprises multiple-bits selectors of $AX_0$ to $AX_n$ and $AY_0$ to $AY_n$.

Signals 16 selected by the first selector 3 and signals 17 selected by the second selector 4 are supplied to the multiplexer 5. The multiplexer 5 is multiplexed at time sharing upon reception of a real-time control signal 18 supplied by the exercizer. The multiplexer 5 outputs the address bits $A_0$ to $A_n$ which are supplied to the DUT 6.

The operation of the real-time address circuit will be described with reference to the timing chart in FIG. 2.

FIG. 2(a) shows a waveform of the signal 11 and FIG. 2(b) is a waveform of the signal 12. The signal 12 comprises the normal mode and the mutiple-bits test mode. FIG. 2(c) is a waveform of the output signal 13 and forms a normal select data and the signal 11 in response to the signal 11. FIG. 2(d) is a waveform of the AX address signal 14 and forms $AX_0$. FIG. 2(e) is a waveform of the signel 16 and forms $AY_0$. FIG. 2(f) is a waveform of the signal 16 and forms $AX_0$ at both the normal mode and the multiple-bits parallel test mode. FIG. 2(g) is a waveform of the signal 17. The signal 17 forms $AY_0$ at the normal mode and "0" at the multiple-bits parallel test mode. FIG. 2(h) is a waveform of the signal 18. FIGS. 2(i) to FIG. 2(m) are waveforms to be supplied from the multiplexer 5 to the DUT 6.

The AX AY patterns to be added to the DUT 6 at the normal mode and the multiple-bits parallel test mode and the 4 MDRAM 8 bits data bit size are listed as follows.

| P | Q1 | Q2 | R1 | R2 |
|---|---|---|---|---|
| $A_0$ | $AX_0$ | $AY_0$ | $AX_0$ | — |
| $A_1$ | $AX_1$ | $AY_1$ | $AX_1$ | $AY_0$ |
| $A_2$ | $AX_2$ | $AY_2$ | $AX_2$ | $AY_1$ |
| $A_3$ | $AX_3$ | $AY_3$ | $AX_3$ | $AY_2$ |
| $A_4$ | $AX_4$ | $AY_4$ | $AX_4$ | $AY_3$ |
| $A_5$ | $AX_5$ | $AY_5$ | $AX_5$ | $AY_4$ |
| $A_6$ | $AX_6$ | $AY_6$ | $AX_6$ | $AY_5$ |
| $A_7$ | $AX_7$ | $AY_7$ | $AX_7$ | $AY_6$ |
| $A_8$ | $AX_8$ | $AY_8$ | $AX_8$ | $AY_7$ |
| $A_9$ | $AX_9$ | $AY_9$ | $AX_9$ | $AY_8$ |
| $A_{10}$ | $AX_{10}$ | $AY_{10}$ | — | — |

This table shows addresses to be added to the DUT 6 at the 4 DRAM 8 bits parallel test in which P column shows device addresses, Q1 and Q2 columns show addresses at normal mode, and R1 and R2 columns show addresses at multiple-bits parallel test mode.

Inasmuch as the present invention is provided with the selectors 3 and 4 for subjecting the pattern selection for the AX AY addresses to be added to the DUT 6, a gate for controlling the selectors at the real time, a register 1 for latching the data bit size data and a multiplexer 5 for receiving the outputs of the selectors 3 and 4 and switching the AX AY addresses, it is possible to effect the DRAM multiple-bits parallel mode test.

Although the invention has been described in its preferred form with a certain degree of paticularity, it is to be understood that many variations and changes are possible in the invention without departing from the scope thereof.

What is claimed is:

1. A real-time address switching circuit comprises:
    means for outputting size data, a real-time control signal, an AX address which includes a plurality of first address signals, an AY address which includes a plurality of second address signals, and a multiplexer control signal;
    a device under test which has a plurality of inputs;
    a register which latches said size data and has an output;
    a gate having an output and having two inputs to which are respectively applied said output of said register and said real-time control signal;
    a first selector having a plurality of outputs, having a plurality of inputs coupled to respective said first address signals, and having means responsive to said output of said gate for selectively supplying to said outputs of said first selector one of a plurality of first signal patterns, each said first signal pattern being a unique combination of signals which are each supplied to a respective said output of said first selector and which are each one of a predetermined logic level and a respective said first address signal;
    a second selector having a plurality of outputs, having a plurality of inputs coupled to respective said second address signals, and having means responsive to said output of said gate for selectively supplying to said outputs of said second selector one of a plurality of second signal patterns, each said second signal pattern being a unique combination of signals which are each supplied to a respective said output of said second selector and which are each one of a predetermined logic level and a respective said second address signal; and
    a multiplexer having a first group of inputs each coupled to a respective one of said outputs of said first selector, having a second group of inputs each coupled to a respective one of said outputs of said second selector, having a plurality of outputs each coupled to a respective said input of said device under test, and having-means responsive to said multiplexer control signal for selectively supplying to said outputs of said multiplexer the signals from a responsive one of said first said second groups of inputs.

* * * * *